US012674833B2

(12) United States Patent
Alkkiomäki et al.

(10) Patent No.: US 12,674,833 B2
(45) Date of Patent: Jul. 7, 2026

(54) METHOD AND APPARATUS FOR MONITORING THE CONDITION OF A POWER SEMICONDUCTOR MODULE

(71) Applicant: ABB Schweiz AG, Baden (CH)

(72) Inventors: Olli Alkkiomäki, Helsinki (FI); Panagiotis Kakosimos, Västerås (SE); Kari Tikkanen, New Berlin (FI); Teppo Pirttioja, Helsinki (FI); Aleksi Vulli, Helsinki (FI)

(73) Assignee: ABB SCHWEIZ AG, Baden (CH)

( * ) Notice: Subject to any disclaimer, the term of this patent is extended or adjusted under 35 U.S.C. 154(b) by 333 days.

(21) Appl. No.: 18/464,372

(22) Filed: Sep. 11, 2023

(65) Prior Publication Data

US 2024/0088782 A1 Mar. 14, 2024

(30) Foreign Application Priority Data

Sep. 13, 2022 (EP) .................................... 22386062

(51) Int. Cl.
G01R 31/26 (2020.01)
G01K 1/02 (2021.01)
(Continued)

(52) U.S. Cl.
CPC ..... G01R 31/2642 (2013.01); G01R 31/2812 (2013.01); G01R 31/70 (2020.01);
(Continued)

(58) Field of Classification Search
CPC ................ G01R 31/2642; G01R 31/70; G01R 31/2812; G01R 31/002; H05K 7/2089;
(Continued)

(56) References Cited

U.S. PATENT DOCUMENTS

| | | | | | |
|---|---|---|---|---|---|
| 5,838,568 A | * | 11/1998 | Dickinson | .............. | G01R 31/30 |
| | | | | | 700/121 |
| 2002/0010877 A1 | * | 1/2002 | Ernst | ...................... | G11C 29/48 |
| | | | | | 714/724 |

(Continued)

OTHER PUBLICATIONS

FIDRI/EIF200; "Abb motion control drives: Firmware manual, ACSM1 motion control program", ABB Oy; Jun. 29, 2005; Retrieved from the Internet, Jan. 16, 2019, URL:https://library.e.abb.com/public/6eb2fea8f1da46609c57a06a71007e61/ACSM1-FW_motion_revH_screen_A4.pdf; 508 Pages.

(Continued)

*Primary Examiner* — Raul J Rios Russo
(74) *Attorney, Agent, or Firm* — Greenberg Traurig, LLP

(57) ABSTRACT

A field of electric drive devices and arrangements including a plurality of power semiconductor components formed in or on a common substrate, and more particularly to a method and an apparatus for monitoring the condition of a power semiconductor module. The method for monitoring the condition of a power semiconductor module of an electric drive device connected to an electric machine includes the steps of engaging a locking of the rotor of the electric machine at zero speed or at near zero speed by injecting DC currents by the electric drive device, initiating test temperature recording in the power semiconductor module, disengaging the locking the rotor of the electric machine by the electric drive device, terminating the test temperature recording and storing the recorded data of the test temperature as test temperature data, and determining the condition of the power semiconductor module utilising the test temperature data.

15 Claims, 7 Drawing Sheets

(51) Int. Cl.

| | |
|---|---|
| *G01K 1/022* | (2021.01) |
| *G01K 7/22* | (2006.01) |
| *G01K 13/00* | (2021.01) |
| *G01R 31/28* | (2006.01) |
| *G01R 31/70* | (2020.01) |
| *H02P 3/24* | (2006.01) |
| *H02P 29/68* | (2016.01) |
| *H05K 7/20* | (2006.01) |

(52) U.S. Cl.
CPC ............. *G01K 1/022* (2013.01); *G01K 1/026* (2013.01); *G01K 7/22* (2013.01); *G01K 13/00* (2013.01); *H02P 3/24* (2013.01); *H02P 29/68* (2016.02); *H05K 7/2089* (2013.01)

(58) Field of Classification Search
CPC ........... H02P 3/24; H02P 29/68; G01K 1/022; G01K 1/026; G01K 7/22; G01K 13/00; H02M 1/327
USPC ........................................................ 324/537
See application file for complete search history.

(56) References Cited

U.S. PATENT DOCUMENTS

| | | | | |
|---|---|---|---|---|
| 2002/0112206 A1* | 8/2002 | Richter | .............. | G01R 31/3187 |
| | | | | 714/728 |
| 2005/0270057 A1* | 12/2005 | Schaffer | ............... | G01R 1/0735 |
| | | | | 324/756.02 |
| 2009/0206868 A1* | 8/2009 | Laisne | .......... | G01R 31/318371 |
| | | | | 324/754.21 |

OTHER PUBLICATIONS

Unknown; "ACC800: Firmware manual, CraneDrive application program 7.43 (+N652)"; Sep. 15, 2010; Retrieved from the Internet, Oct. 12, 2018, URL:http://www.mke.co.uk/files/abbacs800cr anedrivemanualn652.pdf; 242 Pages.
European Search Report; Application No. EP 22 38 6062; Completed: Feb. 21, 2023; 2 Pages.

* cited by examiner

DC+

16

13

15

12

14

11

3-PHASE
OUTPUT

17

DC—

METHOD AND APPARATUS FOR MONITORING THE CONDITION OF A POWER SEMICONDUCTOR MODULE

TECHNICAL FIELD

The present invention relates to the field of electric drive devices and arrangements comprising a plurality of power semiconductor components formed in or on a common substrate, and more particularly to a method and an apparatus for monitoring the condition of a power semiconductor module.

BACKGROUND

Electric drive devices i.e., electric drives, are used in industry for different applications, such as for driving motors within the transportation industry, for driving different devices within the process and manufacturing industry as well as within the energy industry. There are applications commonly used for electric drives within the transportation industry for example in metro and railway traffic applications as well as in ship propulsion unit applications of the marine industry. Within the process and manufacturing industry, electric drives can be used for example in conveyer applications, in mixer applications or even in paper machine applications. Within the energy industry, electric drives can be used for example as electric drives for wind turbines of the wind power industry.

Power semiconductors can be arranged into power semiconductor modules, such as, insulated gate bipolar transistor (IGBT) modules, which can include semiconductors configured into an inverter bridge leg or a whole inverter bridge. Modern power semiconductors are not ideal. They produce losses which manifest themselves in heat. This heat can cause overheating, which, in turn, can cause in a failure in the power semiconductor. For this reason, power semiconductors typically require cooling during operation. The power semiconductor module can also include a cooling interface or a cooling element. For example, semiconductors can be mounted on a thermally conductive base plate in a module in order to provide a path for transferring heat from the semiconductors. The base plate can then be connected to a cooling element. The cooling element transfers heat from the power semiconductor module to, for example, a flow of air. The cooling element can be dimensioned such that the power semiconductor module does not overheat under normal operating conditions.

Chip temperature is one of the most critical parameters in power modules. Since a direct temperature measurement is not possible, chip temperatures are usually estimated by measuring the temperature of the base plate and using thermal models. However, there is a single point of measurement in a power semiconductor module obscuring the collected information in most cases. If a chip has failed or is about to fail, it may not be detected prematurely because all the chips contribute to base plate temperature increases.

The power semiconductor is exposed to fluctuating environmental and loading conditions, which cause temperature oscillations. The thermal expansion of the materials of which a semiconductor is composed exhibits dissimilar characteristics. Because of the temperature swings and the material differences, cracks, voids, and delamination are induced at the surface of the multi-layer module structure. The reduction of the heat conduction area creates solder fatigue. The case temperature has been quite often used for detecting module failures; however, since the separation of solder, thermal interface materials, fan, and heatsink issues has been difficult to be separated, its use and applicability has been rather limited.

One popular method of monitoring the condition of power semiconductor modules involves using temperature measurements. The thermal behaviour of power semiconductors is often used for monitoring their condition. The existing techniques can be classified in two main types based on which thermal parameters as well as temperatures (i.e., case or junction temperatures) are monitored. When monitoring the junction temperature, a common practice is to obtain the parameters of the thermal equivalent circuit by fitting the junction cooling curves.

Since direct measurement of the chip temperature is not viable, the junction temperature is thus calculated by measuring the temperature of the base plate and using a thermal model. An NTC sensor (NTC, Negative Temperature Coefficient) is integrated into some power semiconductor modules making temperature measurements feasible. The overall fatigue of a power semiconductor module can thus be determined by monitoring the base plate temperature and the temperature cycles it experiences during its life.

To achieve a closer thermal coupling and higher accuracy, the NTC sensor is mounted near the silicon chips. Usually, a power semiconductor module contains several chips and only one temperature sensor, so the same distance from the sensor cannot be maintained. Moreover, internal design and isolation considerations do not allow the sensor to be placed at the heat dissipation path. The majority of the heat is dissipated to the environment through the heatsink increasing the temperature of the baseplate and DCB material (DCB, Direct Copper Bonding).

There is a significant drawback with prior art solutions for monitoring the condition of a power semiconductor module. The main drawback is that the junction temperature is not directly measured; thus, it is obtained e.g. by using the saturation voltage. Due to the fact that a small current must be injected, and a voltage transducer of high bandwidth must be used, this method is invasive and not practical in the field. Also, the thermal parameters must be calibrated when a new module is in use.

This implicit manner of getting the temperature input hinders its direct use for monitoring the condition of power modules. For example, the NTC sensor reading cannot be used to monitor fast transient phenomena with a small time constant in relation to that of the heat dissipation. It is more suitable to represent the case temperature in steady-state operating conditions. However, even in that case, the availability of a single point of measurement complicates understanding if a chip is about to fail (e.g. bond wire lift-off) due to the heat dissipated from the rest chips. A temperature difference may be caused, but its effect is expected to be smoothened out. Consequently, the inherent delay and sensor distance from the chips obscure the direct evaluation of the reading.

Furthermore, even thermal distribution must be considered when using the case temperature (more specifically, the temperature difference of the case and ambient). Detecting module failures is possible by extracting a look-up table containing the recorded case temperatures as a function of the module losses or by monitoring the estimated thermal resistance. However, the degradation of the thermal interface material and cooling means (e.g. fan, heatsink) also induce changes in the case temperature. The separation of the different causes by monitoring the thermal parameters via curve-fitting is a complicated process here as well. Most of the existing methods require conducting extensive tests in a laboratory environment under different operating conditions (e.g. fan speeds, loading, switching frequency, etc.). Post-processing of the captured signals is necessitated for extracting features and deciding the condition of the module, whereas the separation of issues originating from the cooling means is difficult.

There is a demand in the market for a method and an apparatus for monitoring the condition of a power semiconductor module that would provide a simple but effective method that can be performed by an apparatus for identifying whether a fault or a damage in a power semiconductor module dissipates increased heat and for deciding the condition of a power semiconductor module.

SUMMARY

The object of the invention is to introduce a method and an apparatus for monitoring the condition of a power semiconductor module, which would provide a solution for identifying whether a fault or a damage in a power semiconductor module dissipates increased heat and for deciding the condition of a power semiconductor module. Advantageous embodiments are furthermore presented.

It is brought forward a new method for monitoring the condition of a power semiconductor module of an electric drive device connected to an electric machine, which method comprises the steps of: engaging a locking of the rotor of said electric machine at zero speed or at near zero speed by injecting DC currents by said electric drive device, initiating test temperature recording in said power semiconductor module, disengaging said locking the rotor of said electric machine by said electric drive device, terminating said test temperature recording and storing the recorded data of the test temperature as test temperature data, and determining the condition of the power semiconductor module utilising said test temperature data.

In a preferred embodiment of said method, said locking of the rotor is carried out with a DC-hold function of said electric drive device.

In a preferred embodiment of said method, wherein before said step of engaging parameter values of said DC-hold function are set, said parameter values comprising an angle parameter value of the current injected by the DC-hold function.

In a preferred embodiment of said method, said said angle parameter value of said DC-hold function is set to any one of the following values: $\frac{1}{6}$, $\frac{2}{6}$, $\frac{3}{6}$, $\frac{4}{6}$, $\frac{5}{6}$ or 0.

In a preferred embodiment of said method, said parameter values of said DC-hold function comprise an amplitude parameter value of the current injected by the DC-hold function.

In a preferred embodiment of said method, said amplitude parameter value of said DC-hold function is set to a nominal parameter value or to a maximum parameter value.

In a preferred embodiment of said method, at the start of said method the power semiconductor module is at thermal equilibrium and the electric drive device is not in use.

In a preferred embodiment of said method, before said step of determining the method comprises the step(s) of: concluding whether the test steps according to the method are to be carried out with another angle parameter value of the current injected by said DC-hold function, and when the result of said step of concluding is "YES", the steps of engaging, initiating, disengaging and terminating are repeated one or more times until the result of said step of concluding is "NO".

In a preferred embodiment of said method, said test temperature data comprises the value of the initial test temperature, $\theta_{initial}$, the value of the final test temperature $\theta_{final}$, the test temperature difference $\theta_{final}-\theta_{initial}$, and/or the complete test temperature graph data.

In a preferred embodiment of said method, during said method the speed of a fan of said electric drive device is set to a value of 80%-100% of the maximum fan speed value.

In a preferred embodiment of said method, during said method the speed of a fan of said electric drive device is set to a value of 0%-20% of the maximum fan speed value.

In a preferred embodiment of said method, said step of disengaging is executed when the locking of the rotor has been engaged for a certain time period or when the machine overload level of said electric drive device is reached.

Furthermore, it is brought forward a new apparatus for monitoring the condition of a power semiconductor module of an electric drive device in an arrangement including an electric drive device connected to an electric machine, the apparatus comprising: means for locking of the rotor of said electric machine at zero speed or at near zero speed by injecting DC currents, means for recording test temperature in said power semiconductor module and storing the recorded data of the test temperature as test temperature data, and means for determining the condition of the power semiconductor module utilising said test temperature data.

In a preferred embodiment of said apparatus, said means for said locking of the rotor include a DC-hold function arranged in said electric drive device.

In a preferred embodiment of said apparatus, said electric drive device is a frequency converter.

BRIEF DESCRIPTION OF THE DRAWINGS

In the following, the present invention will be described in more detail by way of example and with reference to the attached drawings, in which.

The foregoing aspects, features and advantages of the invention will be apparent from the drawings and the detailed description related thereto.

In the following, the invention will be described in greater detail by means of preferred embodiments with reference to the accompanying drawings of FIGS. 1 to 8.

DETAILED DESCRIPTION

The apparatus for monitoring the condition of a power semiconductor module of an electric drive device in an arrangement including an electric drive device connected to an electric machine according to one embodiment of the present invention comprises means for locking of the rotor of said electric machine at zero speed or at near zero speed by injecting DC currents, means for recording test temperature in said power semiconductor module and storing the recorded data of the test temperature as test temperature data, and means for determining the condition of the power semiconductor module utilising said test temperature data. The method for monitoring the condition of a power semiconductor module of an electric drive device connected to an electric machine according to one embodiment of the present invention comprises the steps of: engaging a locking of the rotor of said electric machine at zero speed or at near zero speed by injecting DC currents by said electric drive device, initiating test temperature recording in said power semiconductor module, disengaging said locking the rotor of said electric machine by said electric drive device, terminating said test temperature recording and storing the recorded data of the test temperature as test temperature data, and determining the condition of the power semiconductor module utilising said test temperature data.

Figure 1:
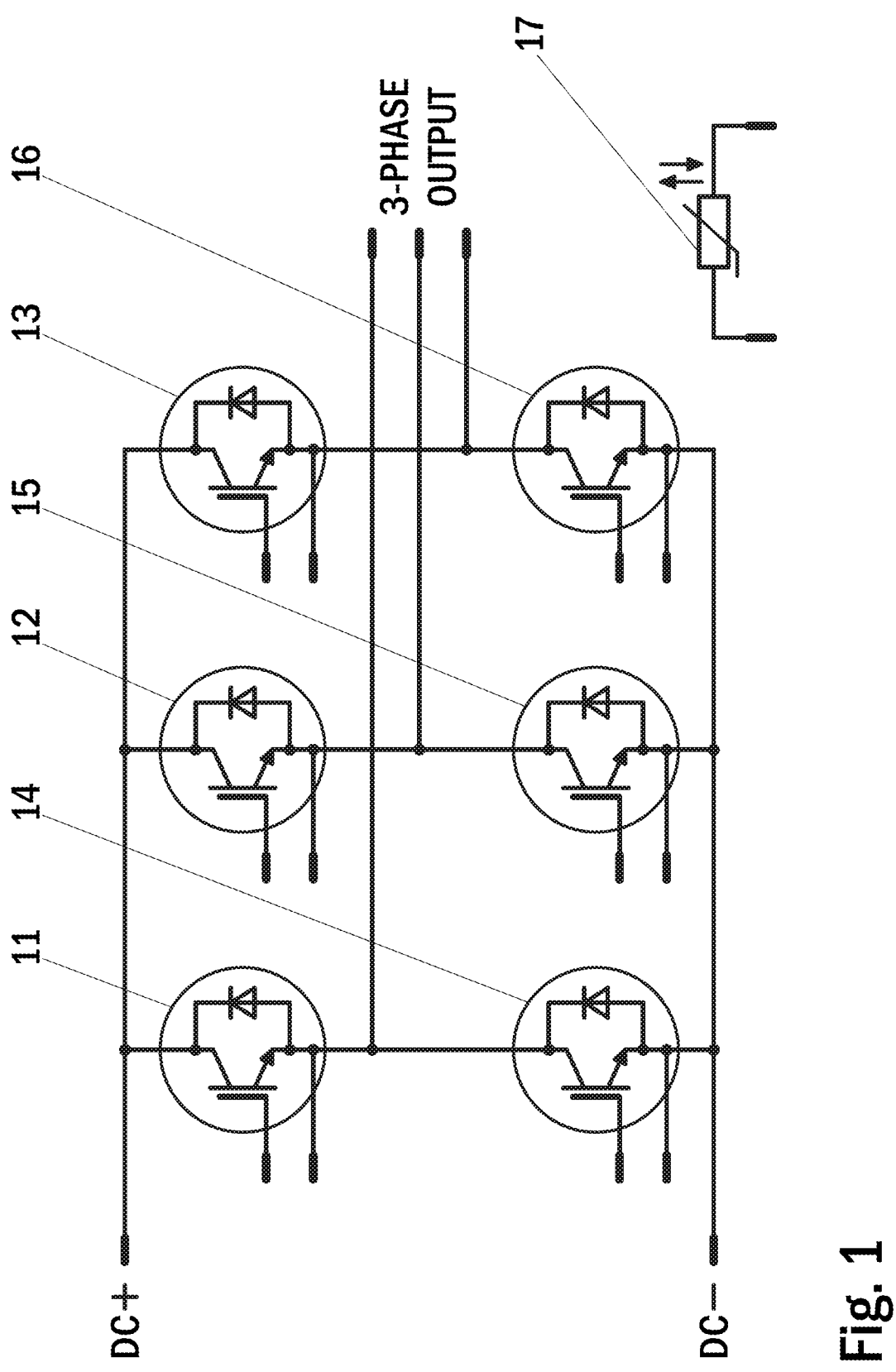
FIG. 1 illustrates a part of one embodiment of a power semiconductor module according to the present invention.

FIG. 1 illustrates a part of one embodiment of a power semiconductor module according to the present invention. The presented power semiconductor module comprises a DC input, six power semiconductor components 11-16 and a three-phase output. Furthermore, said power semiconductor module comprises an NTC sensor 17 arranged for detecting temperature of said power semiconductor module. In the presented power semiconductor module said power semiconductor components 11-16 are IGBT components 11-16 (IGBT, Insulated Gate Bipolar Transistor).

When a failure such as a bond wire lift-off occurs in one power semiconductor component 11-16, the resistance of the current path is anticipated to increase, resulting in increased power losses locally. This will cause the temperatures of the DCB material and baseplate will thus increase further in the vicinity of a faulty semiconductor component 11-16. In the present embodiment the current path in the electric drive is changed from one current path to another in order for altering which power semiconductor component 11-16 dissipates heat each time.

In the present embodiment, a DC-hold function (DC, Direct Current) is engaged at a certain angle and amplitude. Said DC-hold function is a function typically available in some electric drive devices which locks the rotor of the connected electric machine at zero speed or at near zero speed by injecting DC currents.

To intensify the thermal phenomena without damaging the components, the amplitude of the injected current vector is set to a nominal parameter value and said nominal current may be injected for a short duration. The angle may be set to maximise the current flowing through one branch of said power semiconductor components 11-16. Depending on how DC injection is implemented and switching patterns are applied, some current may still flow through the remaining power semiconductor components 11-16 of other branches. However, in the present embodiment the thermal effects in one branch of power semiconductor components 11-16 is amplified by heating the power semiconductor components 11-16 of said branch more than the power semiconductor components 11-16 of other branches. In one embodiment of the present invention the locking of the rotor of said electric machine at zero speed or at near zero speed may also be carried out by altering the modulation for forcing the current to flow through one branch of said power semiconductor components 11-16 of said electric drive device.

With help of the present embodiment, it is then possible to differentiate between temperature increases attributed to the faulty power semiconductor component 11-16 and temperature increases attributed to the non-faulty power semiconductor components 11-16.

Figure 2:
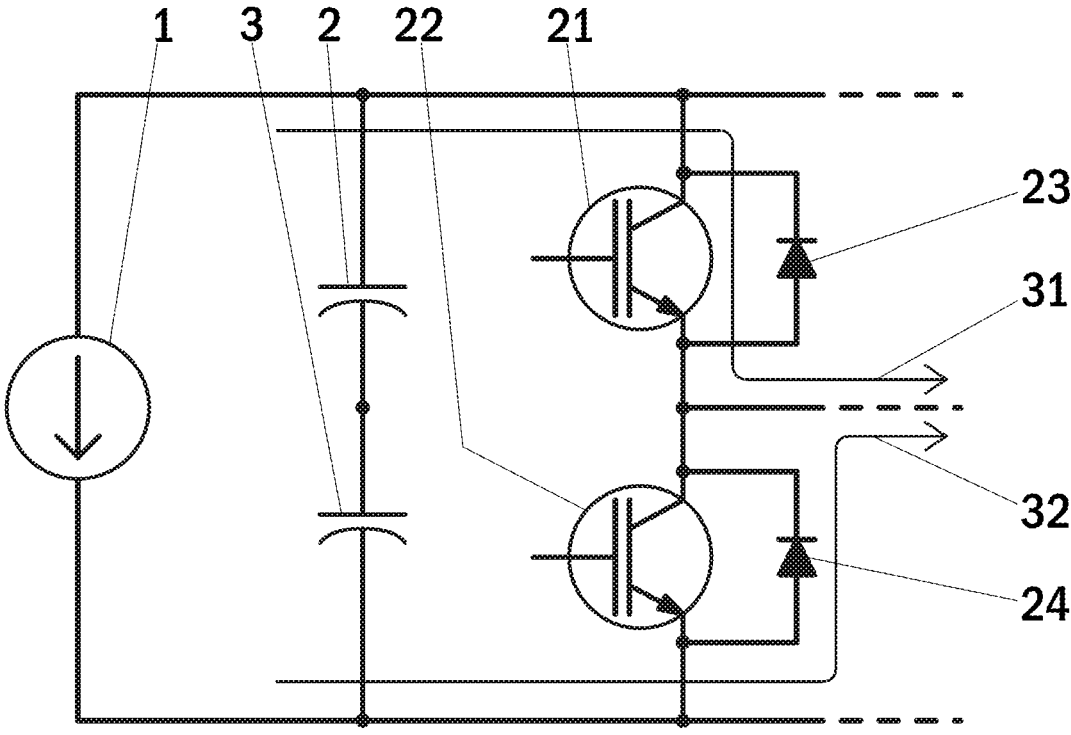
FIG. 2 illustrates one embodiment showing current paths through a part of a power semiconductor module according to the present invention.

FIG. 2 illustrates one embodiment showing current paths through a part of a power semiconductor module according to the present invention. In FIG. 2 there is shown a part of a power semiconductor module according to the present embodiment, which comprises a DC voltage source 1, two polarized DC-link capacitors 2, 3 arranged in series with each other, two IGBT transistors 21, 22 and two diodes 23, 24. Said two IGBT transistors 21, 22 are arranged in series with each other and then connected to the DC voltage source 1 so that the midpoint between said two IGBT transistors 21, 22 provides one phase of the three-phase output. One diode 23 of the said two diodes 23, 24 is connected to one IGBT transistor 21 of said two IGBT transistors 21, 22. Respectively, another diode 24 of the said two diodes 23, 24 is connected to another IGBT transistor 22 of said two IGBT transistors 21, 22.

In the present one embodiment, a DC-hold function engaged, and the amplitude of the injected current vector is set to a nominal parameter value. The angle of the injected current vector is set to a parameter value of $\partial=\frac{4}{6}$. In FIG. 2 the current path 31 through one IGBT transistor 21 of said two IGBT transistors 21, 22 is shown with an arrow marked with a reference number 31 when said one IGBT transistor 21 is switched on. Respectively, in FIG. 2 the current path 32 through another diode 24 of the said two diodes 23, 24 is shown with an arrow marked with a reference number 32 when said one IGBT transistor 21 is switched off.

Figure 3:
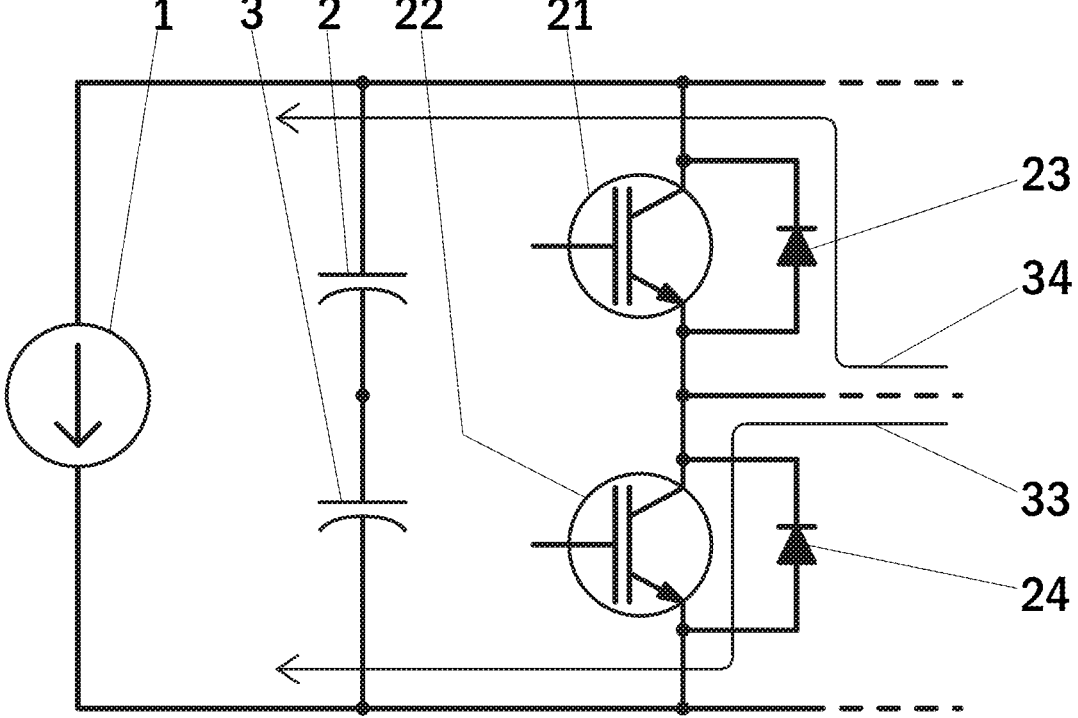
FIG. 3 illustrates another embodiment showing current paths through a part of a power semiconductor module according to the present invention.

FIG. 3 illustrates another embodiment showing current paths through a part of a power semiconductor module according to the present invention. In FIG. 3 there is shown a part of a power semiconductor module according to the present embodiment, which comprises a DC voltage source 1, two polarized DC-link capacitors 2, 3 arranged in series with each other, two IGBT transistors 21, 22 and two diodes 23, 24. Said two IGBT transistors 21, 22 are arranged in series with each other and then connected to the DC voltage source 1 so that the midpoint between said two IGBT transistors 21, 22 provides one phase of the three-phase output. One diode 23 of the said two diodes 23, 24 is connected to one IGBT transistor 21 of said two IGBT transistors 21, 22. Respectively, another diode 24 of the said two diodes 23, 24 is connected to another IGBT transistor 22 of said two IGBT transistors 21, 22.

In the present another embodiment, a DC-hold function is engaged, and the amplitude of the injected current vector is set to a nominal parameter value. The angle of the injected current vector is set to a parameter value of $\partial=\frac{1}{6}$. In FIG. 3 the current path 33 through another IGBT transistor 22 of said two IGBT transistors 21, 22 is shown with an arrow marked with a reference number 33 when said another IGBT transistor 22 is switched on. Respectively, in FIG. 3 the current path 34 through one diode 23 of the said two diodes 23, 24 is shown with an arrow marked with a reference number 34 when said another IGBT transistor 22 is switched off.

Figure 4:
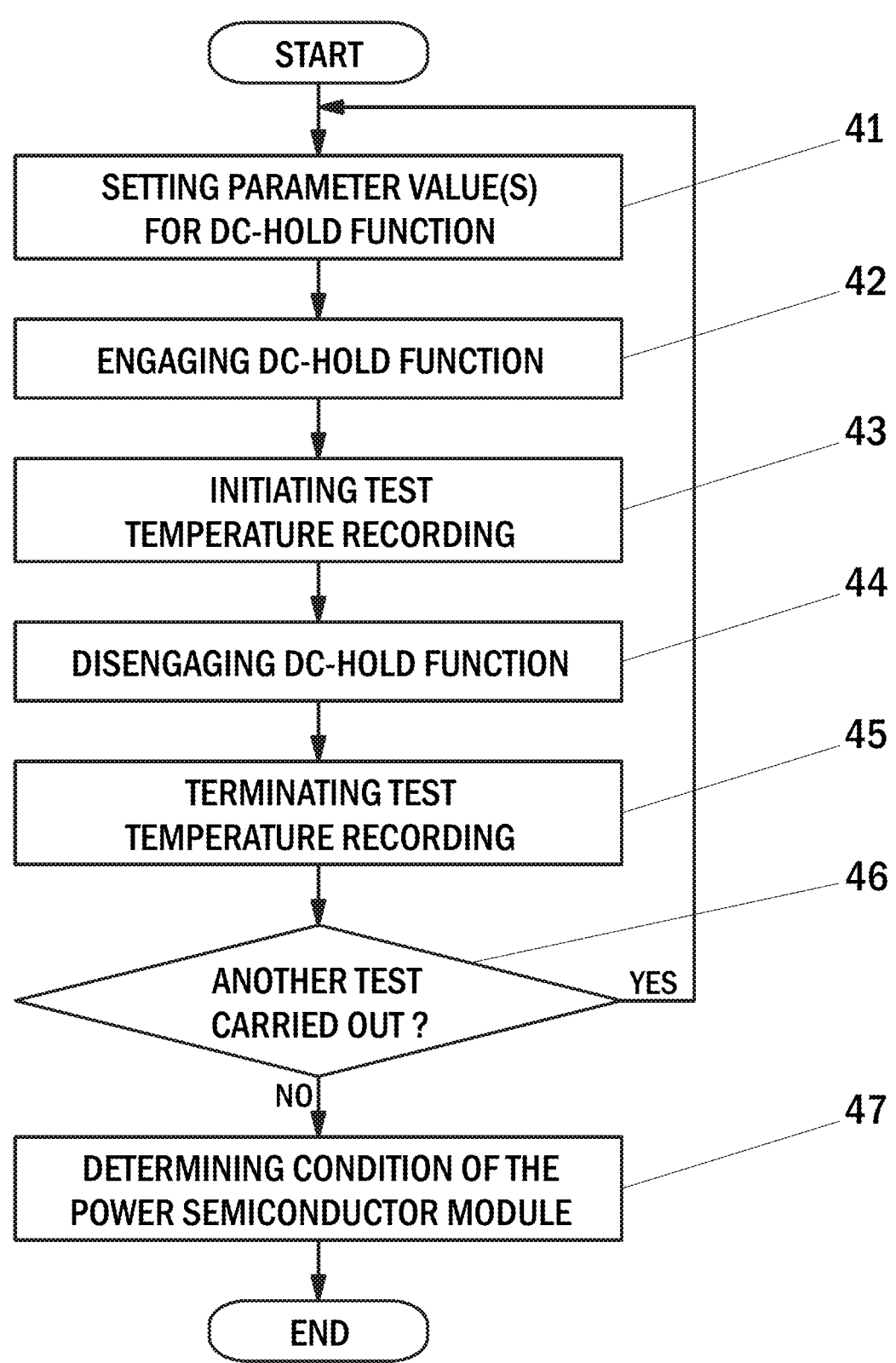
FIG. 4 illustrates a flow diagram of one embodiment of a method according to the present invention for monitoring the condition of a power semiconductor module.

FIG. 4 illustrates a flow diagram of one embodiment of a method according to the present invention for monitoring the condition of a power semiconductor module. In the method according to the present one embodiment the DC-hold function of the electric drive device is activated and the method according to the present embodiment is started. In the start of the test according to the method, the power module may be at thermal equilibrium and the drive may be not in use. After the start of the method the parameter value(s) for the DC-hold function are set 41. The parameter value(s) for the DC-hold function may include an angle parameter value of the current injected by the DC-hold function. The parameter value(s) for the DC-hold function may also include an amplitude parameter value of the current injected by the DC-hold function. For example, the amplitude parameter value of the injected current vector may be set to a nominal value and the angle parameter value of the injected current vector may be set to maximise the current flowing through one branch of said power semiconductor components 11-16, 21-24.

As a next step in the method according to the present one embodiment, the DC-hold function is engaged 42. Shortly before or after or at the same time with engaging 42 the DC-hold function the recording of the test temperature θ in said power semiconductor module is initiated 43. Upon initiating 43 the recording of the test temperature θ, the value of the initial test temperature $\theta_{initial}$ may be stored.

Thereafter, the engaging of the DC-hold function is continued for a predetermined amount of time or until the recorded test temperature θ reaches a predetermined level of thermal equilibrium (i.e., dθ/dt<ε). After said predetermined amount of time has passed or after said predetermined level of thermal equilibrium has been reached, the DC-hold function is disengaged 44. Shortly before or after or at the same time with disengaging 44 the DC-hold function the recording of the test temperature θ in said power semiconductor module terminated 45. Upon terminating 45 the recording of the test temperature θ, the recorded data of the test temperature θ may be stored as test temperature data. Likewise, upon terminating 45 the recording of the test temperature θ, the value of the final test temperature $\theta_{final}$ may be stored. Said test temperature data may include the value of the initial test temperature, $\theta_{initial}$ the value of the final test temperature $\theta_{final}$, the test temperature difference $\theta_{final}-\theta_{initial}$, and/or the complete test temperature graph data.

As a next step in the method according to the present one embodiment it is concluded 46 whether the test steps according to the method are to be carried out with another angle of the injected current. If the answer to the question of said step of concluding 46 is "YES", an amplitude parameter value and an angle parameter value of the current injected by the DC-hold function are set 41. For example, the amplitude parameter value of the injected current vector may be kept at a nominal value and the angle parameter value of the injected current vector may be set to another value to maximise the current flowing through another branch of said power semiconductor components 11-16, 21-24. After setting 41 said amplitude parameter value and said parameter angle value, the steps of engaging the DC-hold function 42, initiating the test temperature θ recording 43, disengaging the DC-hold function 44 and terminating the test temperature θ recording 45 are repeated. Thereafter, the test steps 41-45 according to the method may be yet again carried out with yet another angle of the injected current until it is concluded 46 that there are no more angles of the injected current for carrying out the test steps according to the method. This means that the answer to the question of said step of concluding 46 is "NO", and consequently the DC-hold function of the electric drive device is deactivated. As the final step in the method according to the present one embodiment the condition of the power semiconductor module is determined 47 and the method according to the present embodiment is ended.

In the step of determining 47 the condition of the power semiconductor module said test temperature data is utilised. In particular, said test temperature difference $\theta_{final}-\theta_{initial}$, may be utilised in the determining 47 the condition of the power semiconductor module. Likewise, the temperature change recorded a certain duration after engaging 42 the DC-hold function may be utilised in the determining 47 the condition of the power semiconductor module. Furthermore, in the step of determining 47 an analysis of time constants, temperature rates, parameters of fitted curves and/or other parameters derived from said test temperature data may be utilised.

In FIG. 4 only one embodiment of a method according to the present invention is illustrated. In accordance with the present embodiment only certain power semiconductor components 11-16, 21-24 at one time are heated in a power semiconductor module for monitoring their condition by using the recorded data of the test temperature θ.

In accordance with the present embodiment, the DC-hold function may be disabled for a certain amount of time in between carrying out the test steps for avoiding overheating the motor, e.g. before applying a new parameter angle value. Furthermore, in accordance with the present embodiment, it should be secured that the drive parameters of the electric drive device such as e.g. fan operation parameters, switching frequency parameters and current parameters are not altered by the drive during the several temperature measurement tests.

Figure 5:
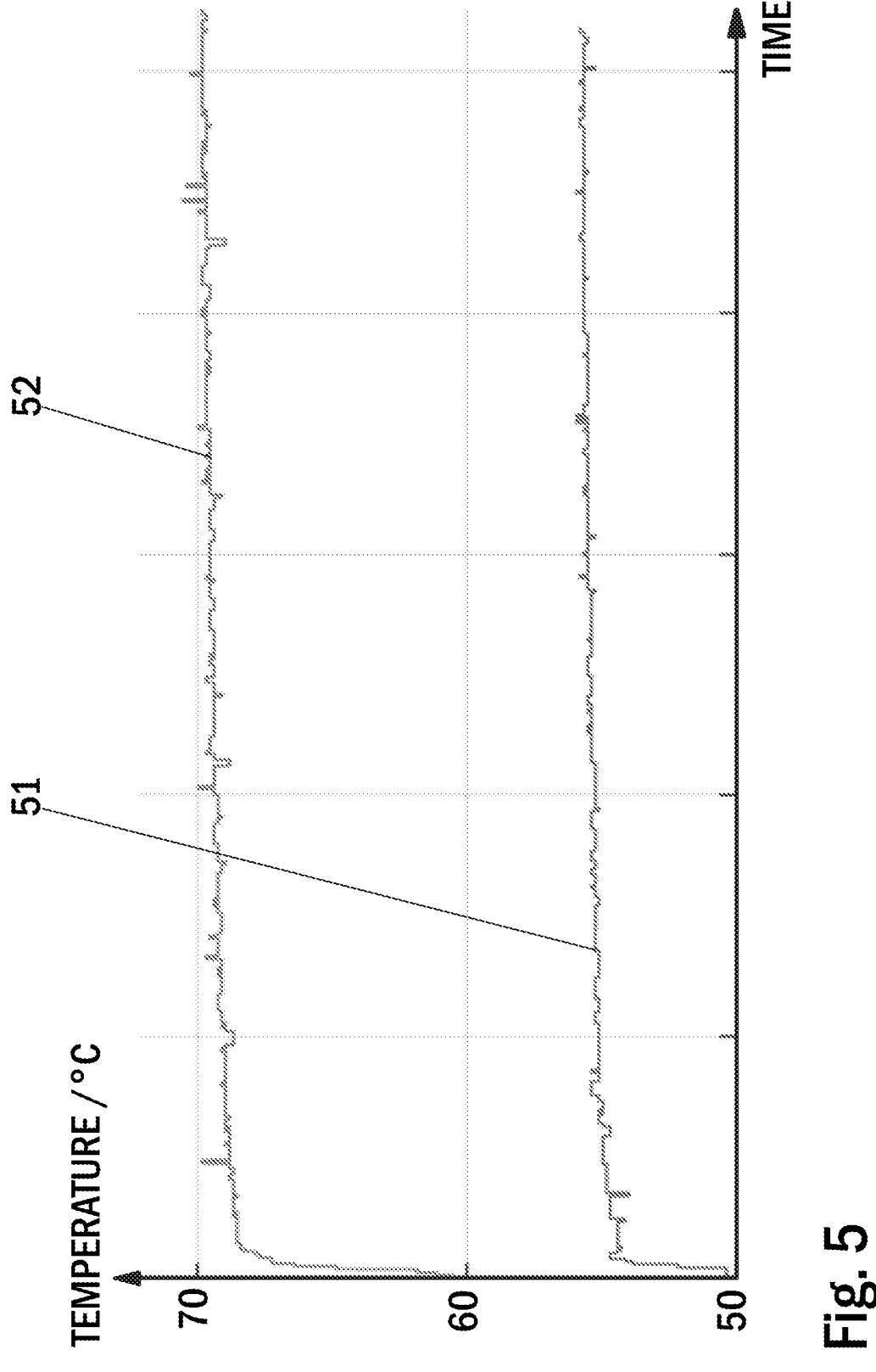
FIG. 5 illustrates one example of the development of temperature versus time in one embodiment of a power semiconductor module according to the present invention.

FIG. 5 illustrates one example of the development of temperature versus time in one embodiment of a power semiconductor module according to the present invention. In the presented example of FIG. 5, the development of the measured temperature versus time was measured in two tests. In the first test an intentional defect was introduced to said power semiconductor module by cutting three bond wires of the total six bond wires in a specific defect location this leaving only three remaining bond wires operational. Thereafter the first test was carried out by engaging the DC-hold function with the amplitude parameter value of the injected current vector being set to a nominal parameter value and the angle parameter value of the injected current vector is set to a parameter value of ∂=⅚ to maximise the current flowing through said specific defect location. In FIG. 5, the graph marked with reference number 51 shows the measured temperature versus time in said first test with three bond wires remaining operational in said specific defect location. In the second test the intentional defect in said power semiconductor of said first test was further damaged by cutting two more bond wires of the previously remaining three bond wires in said specific defect location this now leaving only one remaining bond wire operational. Thereafter the second test was carried out by engaging the DC-hold function with the amplitude parameter value of the injected current vector being set to a nominal parameter value and the angle parameter value of the injected current vector is set to a parameter value of ∂=⅚ to maximise the current flowing through said specific defect location. In FIG. 5, the graph marked with reference number 52 shows the measured temperature versus time in said first test with only one bond wire remaining operational in said specific defect location.

As illustrated in FIG. 5, the test temperature difference $\theta_{final}-\theta_{initial}$, was 6° C. with three remaining bond wires and 10° C. with only one remaining bond wire. The test confirms that the variation of the case temperature is significantly larger when more bond wires were cut indicating a failure in the power semiconductor module. Also as indicated in FIG. 5, the difference in the stabilized temperatures in the two fault tests depicted by graphs 51 and 52 was 15° C. This reveals that when maximum current flows through the damaged chip a higher temperature difference is recorded.

Figure 6:
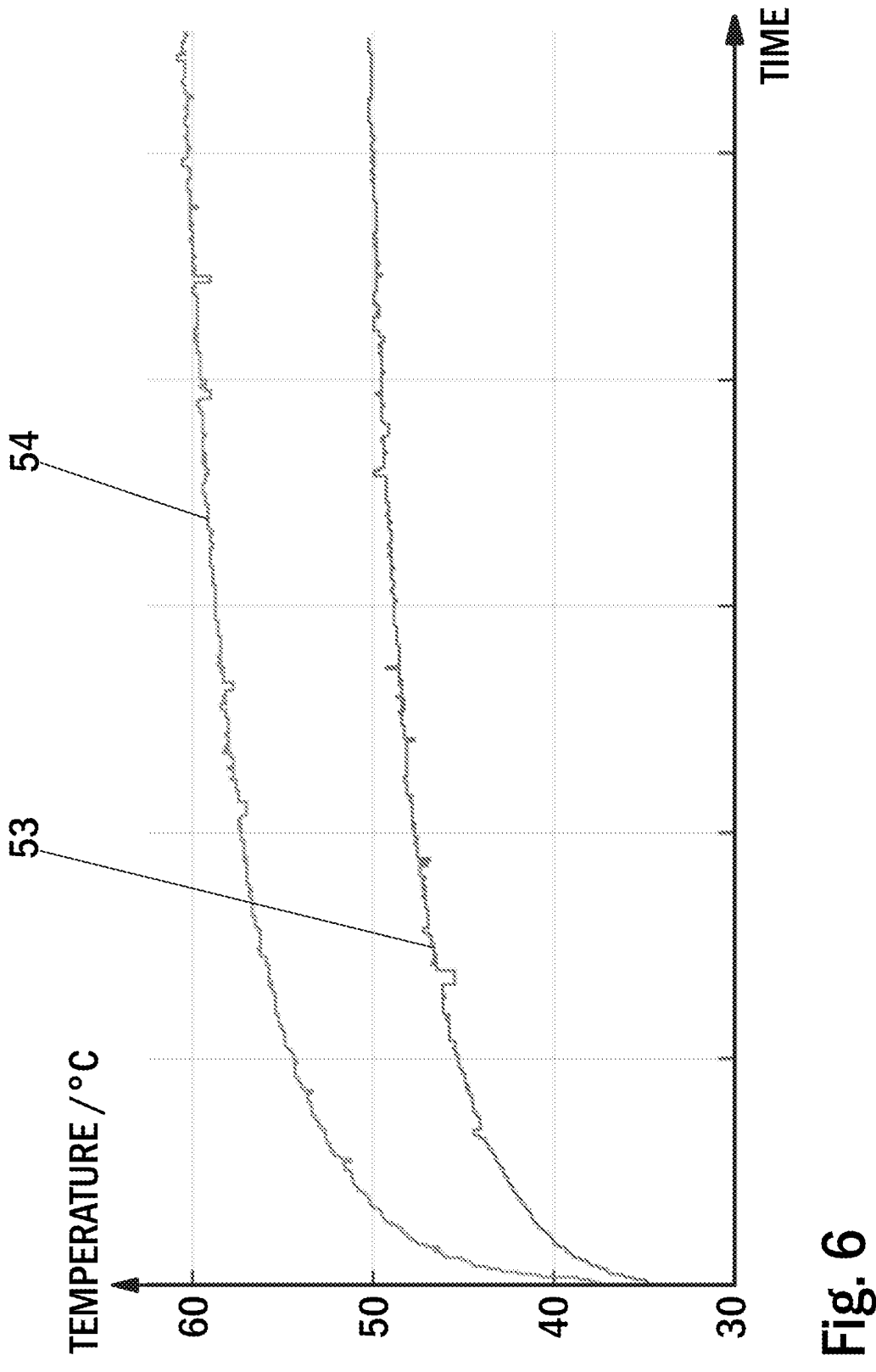
FIG. 6 illustrates another example of the development of temperature versus time in one embodiment of a power semiconductor module according to the present invention.

FIG. 6 illustrates another example of the development of temperature versus time in one embodiment of a power semiconductor module according to the present invention. In the presented another example of FIG. 6, the development of the measured temperature versus time was measured in two tests. In the first test an intentional defect was introduced to said power semiconductor module by cutting three bond wires of the total six bond wires in a specific defect location this leaving only three remaining bond wires operational. Thereafter the first test was carried out by engaging the DC-hold function with the amplitude parameter value of the injected current vector being set to a nominal parameter value and the angle parameter value of the injected current vector is set to a parameter value of $\partial=\frac{1}{6}$ to maximise the current flowing through said specific defect location. In FIG. 6, the graph marked with reference number 53 shows the measured temperature versus time in said first test with three bond wires remaining operational in said specific defect location. In the second test the intentional defect in said power semiconductor of said first test was further damaged by cutting two more bond wires of the previously remaining three bond wires in said specific defect location this now leaving only one remaining bond wire operational. Thereafter the second test was carried out by engaging the DC-hold function with the amplitude parameter value of the injected current vector being set to a nominal parameter value and the angle parameter value of the injected current vector is set to a parameter value of $\partial=\frac{1}{6}$ to maximise the current flowing through said specific defect location. In FIG. 6, the graph marked with reference number 54 shows the measured temperature versus time in said first test with only one bond wire remaining operational in said specific defect location.

As illustrated in FIG. 6, the test temperature difference $\theta_{final}-\theta_{initial}$, was 15° C. with three remaining bond wires and 25° C. with only one remaining bond wire. The test confirms that the variation of the case temperature is significantly larger when more bond wires were cut indicating a failure in the power semiconductor module. Also as indicated in FIG. 6, the difference in the stabilized temperatures in the two fault tests depicted by graphs 53 and 54 was 10° C. This reveals that when maximum current flows through the damaged chip a higher temperature difference is recorded.

The present invention can also be utilised in distinguishing between faults in said electric drive device originating from a failure in the power semiconductor module and faults originating from degradation or failures in thermal material interface or in a cooling means, e.g. a cooling fan or a cooling heatsink of said electric drive device.

Figure 7:
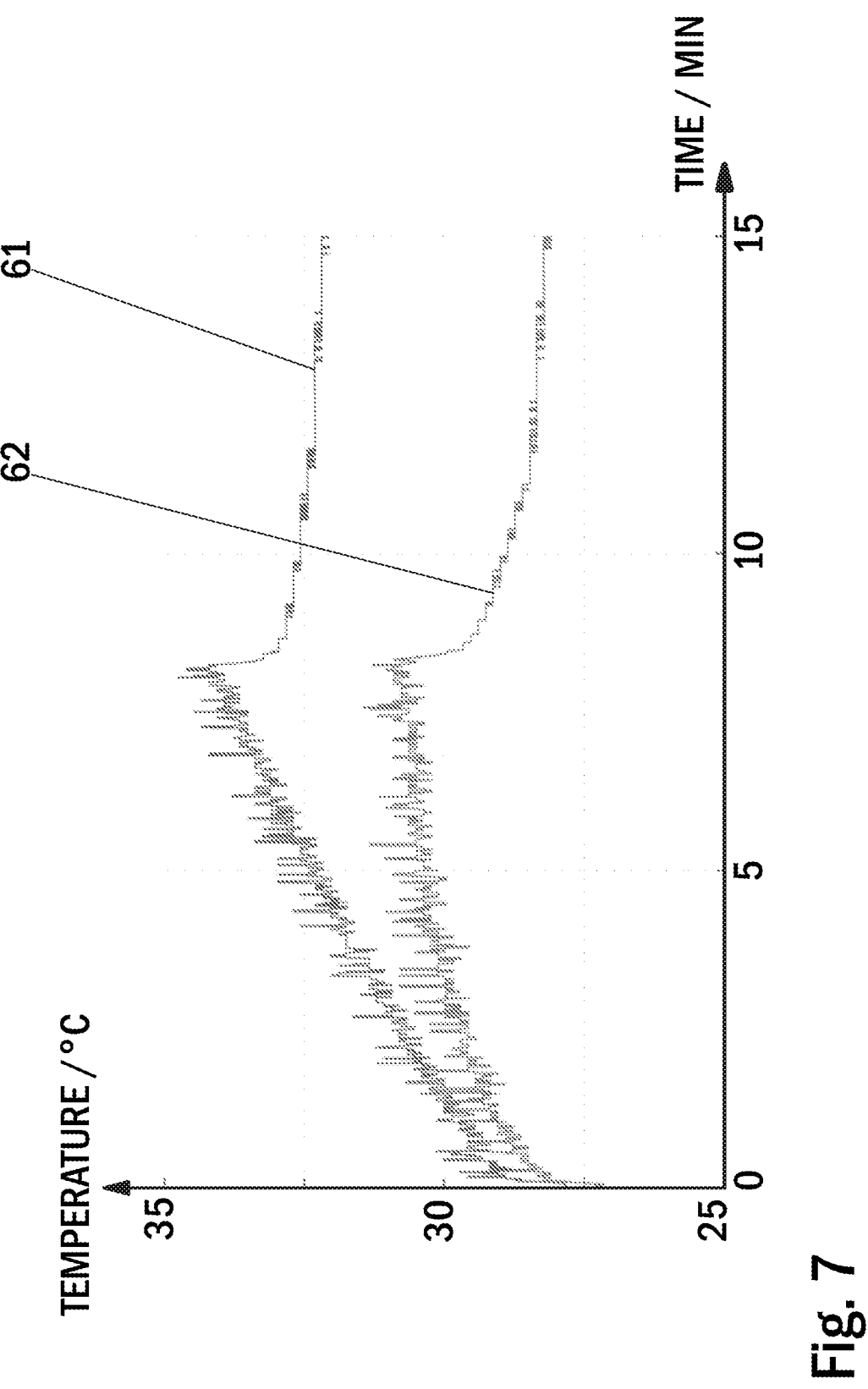
FIG. 7 illustrates a third example of the development of temperature versus time in one embodiment of a power semiconductor module according to the present invention.

FIG. 7 illustrates a third example of the development of temperature versus time in one embodiment of a power semiconductor module according to the present invention. In the presented third example of FIG. 7, the development of the measured temperature versus time was measured in two tests. In both of said two tests there was no defects was introduced to said power semiconductor module. The first test was carried out by engaging the DC-hold function with the amplitude parameter value of the injected current vector being set to a nominal parameter value and the reference speed of the fan of said electric drive device is set to a near-zero speed, i.e. to a value of 0%-20% of the maximum fan speed value. In the first test the electric drive device is heating up the power semiconductor module for a certain time period or until the machine overload level of said electric drive device is reached; whichever comes first. Then, the DC-hold function is disengaged until the end of the first test. Since the fan is set at near-zero speed, only the temperature of the power semiconductor module is monitored during this first test. In FIG. 7, the graph marked with reference number 61 shows the measured temperature versus time in said first test with fan set to near-zero speed. In the second test the fan speed of said electric drive device is set to a near-maximum speed, i.e. to a value of 80%-100% of the maximum fan speed value. Thereafter the second test was likewise carried out by engaging the DC-hold function with the amplitude parameter value of the injected current vector being set to a nominal parameter value and the reference speed of the fan of said electric drive device is set to its near-maximum value (i.e., 80%-100%). In the second test the electric drive device is heating up the power semiconductor module for a certain time period or until the machine overload level of said electric drive device is reached; whichever comes first. Then, the DC-hold function is disengaged until the end of the second test. Since the fan is set to its maximum value, during the cooling phase only the fan is in operation, whereas in the previous first test both the power semiconductor module and the fan were out of operation. In FIG. 7, the graph marked with reference number 62 shows the measured temperature versus time in said first test with fan set to its maximum speed.

As illustrated in FIG. 7, the tests of the presented embodiment allow separating the fan operation from the operation of the power semiconductor module. Also, for fan diagnostics, history data from the first day of operation can be used to signal issues in the cooling means.

Figure 8:
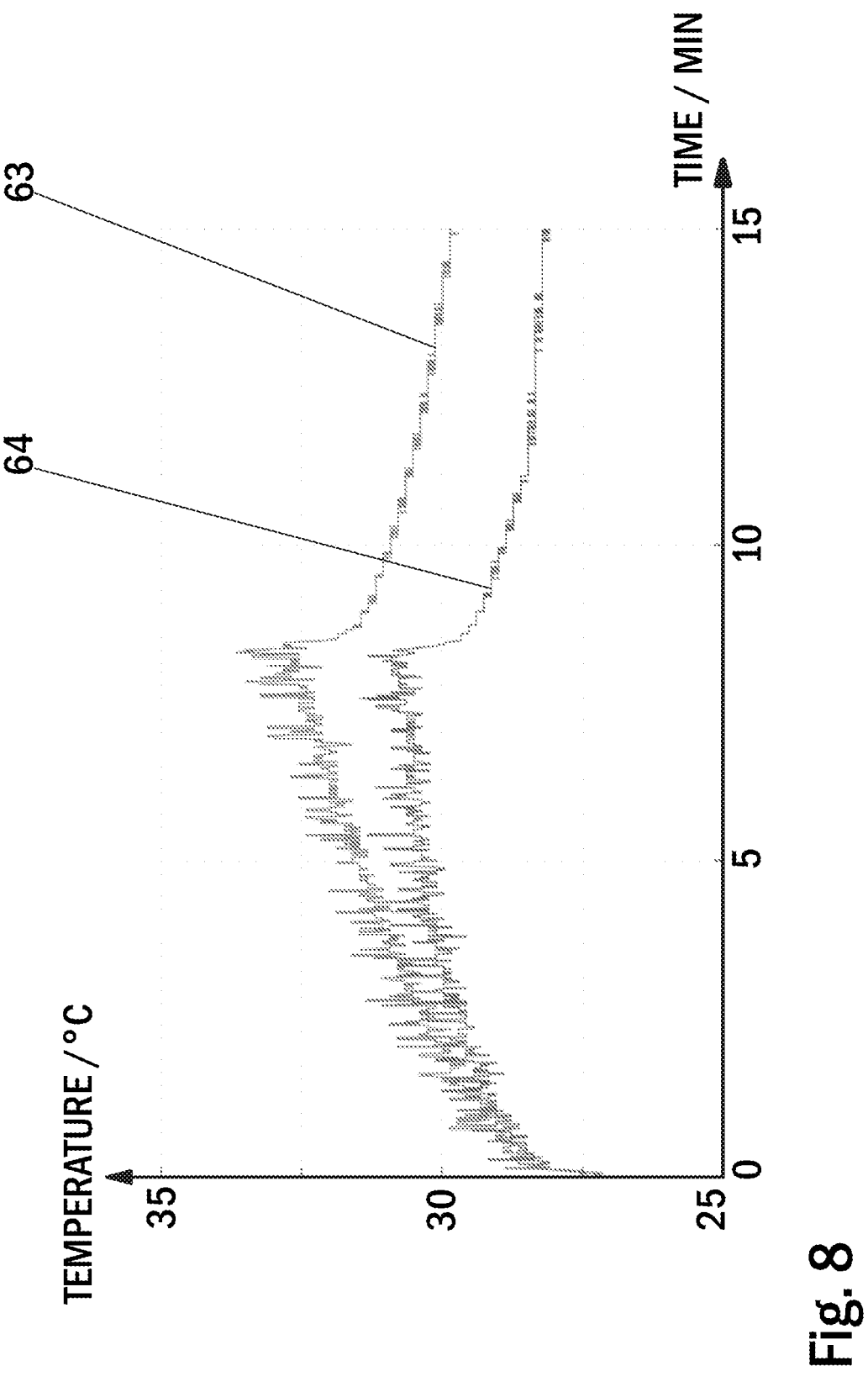
FIG. 8 illustrates a fourth example of the development of temperature versus time in one embodiment of a power semiconductor module according to the present invention.

FIG. 8 illustrates a fourth example of the development of temperature versus time in one embodiment of a power semiconductor module according to the present invention. In the presented fourth example of FIG. 8, the development of the measured temperature versus time was measured in two tests. In both of said two tests there was no defects was introduced to said power semiconductor module. In the first test there was a defect introduced to the fan of said power semiconductor module by blocking the fan and in the second test the fan was unharmed and set for normal operation. The first test was carried out by engaging the DC-hold function with the amplitude parameter value of the injected current vector being set to a nominal parameter value and the fan of said electric drive device was blocked. In the first test the electric drive device is heating up the power semiconductor module for a certain time period or until the machine overload level of said electric drive device is reached; whichever comes first. Then, the DC-hold function is disengaged until the end of the first test. Since the fan is blocked, only the temperature of the power semiconductor module is monitored during this first test. In FIG. 8, the graph marked with reference number 63 shows the measured temperature versus time in said first test with fan blocked. In the second test the fan speed of said electric drive device is set for normal operation. Thereafter the second test was likewise carried out by engaging the DC-hold function with the amplitude parameter value of the injected current vector being set to a nominal parameter value and the fan of said electric drive device is set for normal operation. In the second test the electric drive device is heating up the power semiconductor module for a certain time period or until the machine overload level of said electric drive device is reached; whichever comes first. Then, the DC-hold function is disengaged until the end of the second test. Since the fan is set for normal operation, during the cooling phase only the fan is in operation, whereas in the previous first test the power semiconductor module was out of operation and the fan was blocked. In FIG. 8, the graph marked with reference number 64 shows the measured temperature versus time in said first test with fan set for normal operation.

As illustrated in FIGS. 7 and 8, the temperature slope during the cooling phase is strongly affected by the fan condition, and since the power semiconductor module is out of operation, it helps to identify fan issues when the power semiconductor module also performs poorly. Additionally, when the performance degradation of the power semiconductor module is substantial, the stored data when having zero speed can be used as a baseline for the comparison. In this case, the maximum temperature and slope during the heating up process is expected to be higher and can therefore be isolated from the fan issues.

According to the present invention the diagnostic tests may be performed to each branch of the power semiconductor module separately. In accordance with the present invention, the electric drive device can heat up the power semiconductor module by performing the DC-hold function with keeping the current in its rated value. For speeding up the test, the switching frequency may be set to a constant value such as e.g. to a maximum switching frequency. According to the present invention the diagnostic tests may be executed when the drive is set up on the first day to establish a proper reference data. Furthermore, the diagnostic tests may be executed periodically when the drive does not perform critical tasks e.g. during night and/or weekends. For safety reasons, the diagnostic tests are executed by utilizing the DC-hold function available in the electric drive device, that is without requiring the shaft of the connected electric machine to be rotated. In accordance with the present invention, the existing sensors such as e.g., ambient & temperature sensors in the electric drive device may be utilized. Furthermore, the test temperature data may be analysed also by considering how the power semiconductor components in the power semiconductor module are positioned.

In accordance with the present invention, by performing diagnostic tests in the electric drive device, it is possible to monitor the condition of the power semiconductor module and the condition of the cooling means (e.g., fan, heatsink). In said diagnostic tests the temperatures are recorded during the heating and cooling phases. According to the present invention the diagnostic tests are performed at certain fan speeds, e.g. 0%, 100%, whereas the DC-hold function is ceased during the cooling phase for distinguishing between faults in said electric drive device originating from a failure in the power semiconductor module and faults originating from degradation or failures in thermal material interface or in a cooling means, e.g. a cooling fan or a cooling heatsink of said electric drive device.

With the help of the solution for monitoring the condition of a power semiconductor module according to the present invention there is provided a simple but effective method that can be performed by an apparatus for identifying whether a fault or a damage in a power semiconductor module dissipates increased heat and for deciding the condition of a power semiconductor module.

With the help of the solution according to the present invention the issues arising from the single measurement point are alleviated. In accordance with the present invention, the condition of the power semiconductor components is monitored by analysing test temperature data and considering how the power semiconductor components in the power semiconductor module are positioned.

The solution according to the present invention provides an effective and elegant solution for identifying a failure such as a bond wire lift-off in one power semiconductor component in the power semiconductor module.

It is to be understood that the above description and the accompanying Figures are only intended to teach the best way known to the inventors to make and use the invention. It will be apparent to a person skilled in the art that the inventive concept can be implemented in various ways. The above-described embodiments of the invention may thus be modified or varied, without departing from the invention, as appreciated by those skilled in the art in light of the above teachings. It is therefore to be understood that the invention and its embodiments are not limited to the examples described above but may vary within the scope of the claims and their equivalents.

The invention claimed is:

1. A method for monitoring the condition of a power semiconductor module of an electric drive device connected to an electric machine, which method comprises the steps of:
   setting parameter values of a DC-hold function of said electric drive device, said parameter values include an angle parameter value of the current injected by the DC-hold function, said angle parameter value of said DC-hold function being set to any one of the following values: $\frac{1}{6}$, $\frac{2}{6}$, $\frac{3}{6}$, $\frac{4}{6}$, $\frac{5}{6}$ or 0,
   engaging a locking of the rotor of said electric machine at zero speed with said DC hold function by injecting DC currents by said electric drive device,
   initiating test temperature recording in said power semiconductor module,
   disengaging said locking the rotor of said electric machine by said electric drive device,
   terminating said test temperature recording and storing the recorded data of the test temperature as test temperature data, and
   determining the condition of the power semiconductor module utilising said test temperature data.

2. The method according to claim 1, wherein said parameter values of said DC-hold function include an amplitude parameter value of the current injected by the DC-hold function.

3. The method according to claim 2, wherein said amplitude parameter value of said DC-hold function is set to a nominal parameter value or to a maximum parameter value.

4. The method according to claim 1, wherein at the start of said method the power semiconductor module is at thermal equilibrium and the electric drive device is not in use.

5. The method according to claim 1, wherein before said step of determining the method comprises the step(s) of:
   concluding whether the test steps according to the method are to be carried out with another angle parameter value of the current injected by said DC-hold function, and
   when the result of said step of concluding 46 is "YES", the steps of engaging, initiating, disengaging and terminating are repeated one or more times until the result of said step of concluding is "NO".

6. The method according to claim 1, wherein said test temperature data includes the value of the initial test temperature, $\theta_{initial}$, the value of the final test temperature $\theta_{final}$, the test temperature difference $\theta_{final}-\theta_{initial}$, and/or the complete test temperature graph data.

7. The method according to claim 1, wherein during said method the speed of a fan of said electric drive device is set to a value of 80%-100% of the maximum fan speed value.

8. The method according to claim 1, wherein during said method the speed of a fan of said electric drive device is set to a value of 0%-20% of the maximum fan speed value.

9. The method according to claim 1, wherein said step of disengaging is executed when the locking of the rotor has been engaged for a certain time period or when the machine overload level of said electric drive device is reached.

10. The method according to claim 2, wherein at the start of said method the power semiconductor module is at thermal equilibrium and the electric drive device is not in use.

11. The method according to claim 2, wherein said test temperature data includes the value of the initial test temperature, $\theta_{initial}$, the value of the final test temperature $\theta_{final}$, the test temperature difference $\theta_{final}-\theta_{initial}$, and/or the complete test temperature graph data.

12. The method according to claim 2, wherein during said method the speed of a fan of said electric drive device is set to a value of 80%-100% of the maximum fan speed value.

13. The method according to claim 2, wherein before said step of determining the method comprises the step(s) of:

concluding whether the test steps according to the method are to be carried out with another angle parameter value of the current injected by said DC-hold function, and when the result of said step of concluding 46 is "YES", the steps of engaging, initiating, disengaging and terminating are repeated one or more times until the result of said step of concluding is "NO".

14. An apparatus for monitoring the condition of a power semiconductor module of an electric drive device in an arrangement including an electric drive device connected to an electric machine, the apparatus comprising:

a lock that locks the rotor of said electric machine at zero speed by injecting DC currents, said lock including a DC-hold function arranged in said electric drive device, wherein parameter values of said DC-hold function comprise an angle parameter value of the current injected by the DC-hold function, said angle parameter value of said DC-hold function being set to any one of the following values: $\frac{1}{6}$, $\frac{2}{6}$, $\frac{3}{6}$, $\frac{4}{6}$, $\frac{5}{6}$ or 0, a recorder recording test temperature in said power semiconductor module and storing the recorded data of the test temperature as test temperature data, and a processor determining the condition of the power semiconductor module utilising said test temperature data.

15. The apparatus according to claim 14, wherein said electric drive device is a frequency converter.

* * * * *